(12) United States Patent
Koeppel et al.

(10) Patent No.: US 8,921,709 B2
(45) Date of Patent: Dec. 30, 2014

(54) RF SHIELDING FOR MOBILE DEVICES

(71) Applicant: Continental Accessory Corp., Amityville, NY (US)

(72) Inventors: Richard P. Koeppel, Brookville, NY (US); Ronald H. Koeppel, Brookville, NY (US)

(73) Assignees: Continental Accessory Corp., Amityville, NY (US); Contech RF Devices, LLC, Amityville, NY (US)

( * ) Notice: Subject to any disclaimer, the term of this patent is extended or adjusted under 35 U.S.C. 154(b) by 35 days.

(21) Appl. No.: 13/837,995

(22) Filed: Mar. 15, 2013

(65) Prior Publication Data

US 2014/0262474 A1    Sep. 18, 2014

(51) Int. Cl.
*H05K 1/11*    (2006.01)
*H05K 9/00*    (2006.01)

(52) U.S. Cl.
CPC ................................ *H05K 9/0007* (2013.01)
USPC .......................................... 174/261; 174/257

(58) Field of Classification Search
CPC ........................... H05K 1/0216; H05K 3/0052
USPC ................... 174/255–258, 261; 361/792–795
See application file for complete search history.

(56) References Cited

U.S. PATENT DOCUMENTS

| | | | |
|---|---|---|---|
| 5,335,366 A | 8/1994 | Daniels | |
| 5,336,896 A | 8/1994 | Katz | |
| 5,367,309 A | 11/1994 | Tashjian | |
| 5,657,386 A | 8/1997 | Schwanke | |
| 5,726,383 A | 3/1998 | Geller et al. | |
| 6,001,282 A | 12/1999 | Kanase | |
| 6,075,977 A | 6/2000 | Bayrami | |
| 6,095,820 A | 8/2000 | Luxon et al. | |
| 6,184,477 B1 * | 2/2001 | Tanahashi | 174/261 |
| 6,184,835 B1 | 2/2001 | Chen et al. | |
| 6,341,217 B1 | 1/2002 | Wong | |
| 6,356,773 B1 | 3/2002 | Rinot | |
| 6,359,213 B1 | 3/2002 | Long | |
| 6,377,824 B1 | 4/2002 | Ingbir et al. | |
| 6,404,403 B1 | 6/2002 | Kunz et al. | |
| 6,505,036 B2 | 1/2003 | Zilberberg et al. | |
| 6,515,223 B2 | 2/2003 | Tashjian | |
| 6,603,981 B1 | 8/2003 | Carillo, Jr. et al. | |
| 6,615,028 B1 | 9/2003 | Loke et al. | |
| 6,624,432 B1 | 9/2003 | Gabower et al. | |
| 6,628,784 B1 | 9/2003 | Montane Condemines | |
| 6,708,047 B1 | 3/2004 | Miller et al. | |
| 6,738,650 B1 | 5/2004 | Zhou et al. | |
| 6,897,826 B1 | 5/2005 | Kunz | |

(Continued)

*Primary Examiner* — Jeremy C Norris

(74) *Attorney, Agent, or Firm* — Scully, Scott, Murphy & Presser, P.C.

(57) ABSTRACT

An RF shielding device for mobile devices includes a conductive grid having horizontal and vertical wire traces in electrical contact with each other; a conductive trace disposed around the perimeter of the conductive grid, the conductive trace being in electrical contact with both ends of each of the horizontal and vertical wire traces; a first insulating film disposed on a top surface of the conductive grid; and a second insulating film disposed on a bottom surface of the conductive grid and the conductive trace. The first insulating film and the second insulating film are of a transparent material. The first and second insulating films are transparent, thus allowing viewing of the display of a mobile device on which the RF shielding device is disposed. The vertical and horizontal wire traces are spaced to form a grid that is opaque to signals in the frequency ranges utilized for mobile communication.

18 Claims, 5 Drawing Sheets

(56) References Cited

U.S. PATENT DOCUMENTS

| | | | |
|---|---|---|---|
| 8,270,929 B1 * | 9/2012 | Koeppel et al. | 455/300 |
| 2001/0041545 A1 | 11/2001 | Liberman et al. | |
| 2002/0009976 A1 | 1/2002 | Rashidi | |
| 2002/0072337 A1 | 6/2002 | Teller | |
| 2002/0097188 A1 | 7/2002 | Coloney | |
| 2003/0176164 A1 | 9/2003 | Hefetz | |
| 2003/0228843 A1 | 12/2003 | Mayer | |
| 2004/0026100 A1 | 2/2004 | Mattson et al. | |
| 2004/0198264 A1 | 10/2004 | Saur et al. | |
| 2006/0044206 A1 | 3/2006 | Moskowitz et al. | |
| 2008/0014872 A1 | 1/2008 | Tucek et al. | |
| 2009/0032300 A1 | 2/2009 | Joshi | |

* cited by examiner

RF SHIELDING FOR MOBILE DEVICES

I. FIELD OF THE INVENTION

The present invention relates generally to radio frequency shielding for mobile cellular, or wireless devices including but not limited to mobile phones, tablets, such as Apple iPad®, and eReaders, such as Barnes & Noble Nook® and Amazon Kindle®.

II. BACKGROUND OF THE DISCLOSURE

During normal operation, mobile devices transmit radio-frequency (RF) radiation intermittently during standby periods and continuously during active talk periods. Hereinafter, mobile devices include any device that is portable, and equipped with a cellular or wireless (e.g., Wi-Fi, Bluetooth, near field) communication capability and a display screen. Examples of mobile devices include mobile phones, personal digital assistants (PDA), tablet computers and eReaders. There is concern among public health professionals that the RF radiation emitted from mobile devices may cause a variety of health related issues.

In response to public concern over RF radiation from mobile devices, many devices and mobile device accessories have been marketed as blocking or reducing RF radiation. However, many of these products have drawbacks. For instance, some products are formed as cases to house the mobile device when not in use. However, when receiving or initiating a call, the mobile device will need to be removed from the protective case. Thus, exposing the user to the RF radiation. Other devices prevent the proper functioning of touch screen inputs on many current mobile devices.

Various attempts to reduce exposure to RF radiation from mobile devices are discussed in the following publications: U.S. Pat. No. 5,367,309, U.S. Pat. No. 5,335,366, U.S. Pat. No. 5,336,896, U.S. Pat. No. 5,657,386, U.S. Pat. No. 5,726,383, U.S. Pat. No. 6,001,282, U.S. Pat. No. 6,075,977, U.S. Pat. No. 6,095,820, U.S. Pat. No. 6,184,835, U.S. Pat. No. 6,341,217, U.S. Pat. No. 6,356,773, U.S. Pat. No. 6,359,213, U.S. Pat. No. 6,377,824, U.S. Pat. No. 6,404,403, U.S. Pat. No. 6,505,036, U.S. Pat. No. 6,515,223, U.S. Pat. No. 6,615,028, U.S. Pat. No. 6,624,432, U.S. Pat. No. 6,628,784, U.S. Pat. No. 6,603,981, U.S. Pat. No. 6,708,047, U.S. Pat. No. 6,738,650, U.S. Pat. No. 6,897,826, US Publication No. 2001/0041545, U.S. Publication No. 2002/0072337, U.S. Publication No. 2002/0097188, U.S. Publication No. 2002/0009976, U.S. Publication No. 2003/0228843, U.S. Publication No. 2003/0176164, U.S. Publication No. 2004/0198264, U.S. Publication No. 2004/0026100, U.S. Publication No. 2008/0014872, and U.S. Publication No. 2010/0240421.

III. SUMMARY OF THE DISCLOSURE

An object of the present invention is to provide an RF shielding that protects the mobile device user from potentially harmful RF radiation, while allowing touch screen equipped mobile devices to operate.

An object of the present invention is an RF shielding device having: a conductive grid having horizontal and vertical wire traces in electrical contact with each other; a conductive trace disposed around the perimeter of the conductive grid, the conductive trace being in electrical contact with both ends of each of the horizontal and vertical wire traces; a first insulating film disposed on a top surface of the conductive grid; and a second insulating film disposed on a bottom surface of the conductive grid and the conductive trace, wherein the first insulating film and the second insulating film are of a transparent material.

IV. BRIEF DESCRIPTION OF THE DRAWINGS

These and other features, aspects, and advantages of the present invention will become better understood with regard to the following description, appended claims, and accompanying drawings wherein:

V. DETAILED DESCRIPTION OF DISCLOSURE

Figure 1:
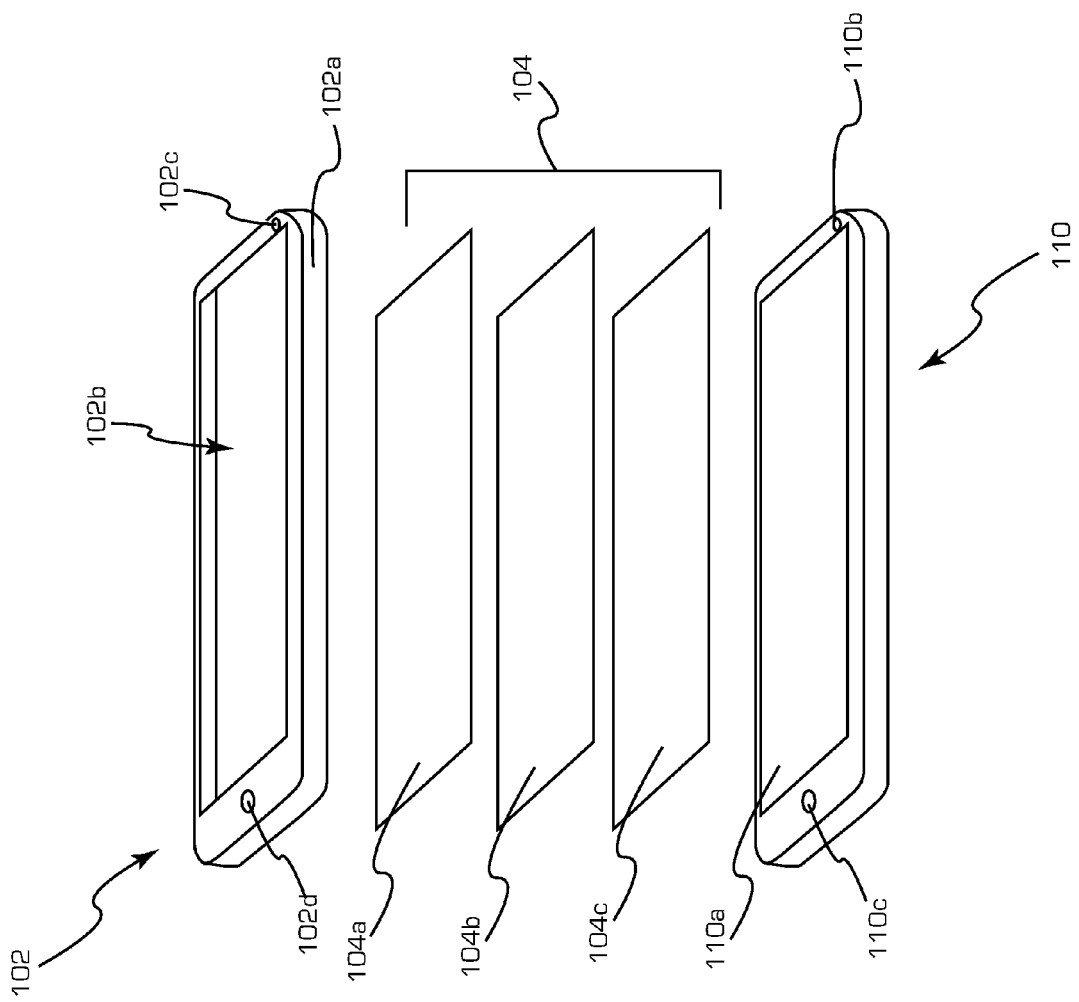
FIG. 1 illustrates an exploded view of an embodiment of the present invention.

Referring to FIG. 1, an embodiment of the present invention is shown in an exploded view. The RF shielding device of the present invention is constructed of a frame member 102 configured and dimensioned to envelop at least a top surface of a mobile device 110. The frame member 102 is particularly sized for a corresponding model of mobile device, thus one frame member 102 may be specific to an iPhone® 4/4s while a second frame member 102, having different dimensions, may be specific to a Google Nexus 10.

The frame member 102 is formed of a plastic, silicone, thermoplastic polyurethane, rubber or metal frame 102*a*. The frame member 102 has a display void 102*b* centrally formed thereon. The display void 102*b* is aligned with an area corresponding to a display 110*a* of the corresponding mobile device 110. Thus, the frame 102*a* encircles a perimeter of the mobile device 110 such that the entirety of the display 110*a* is aligned with and visible though the display void 102*b*.

Since many mobile devices 110 are equipped with forward facing cameras 110*b* and hardware buttons 110*c* on a top surface of the mobile device 110, the corresponding frame member 102 is configured with camera void 102*c* and button void 102*d* corresponding to the forward facing camera 110*b* and hardware button(s) 110*c*, respectively. Alternatively, the button void 102*d* corresponding with the hardware button(s) 110*c* may be formed of a flexible material, such as rubber or an appropriate plastic, that allows for user actuation of the underlying hardware button(s) 102*c*. Moreover, cutouts may be provided for any other components disposed on the front face of the mobile device, for example speaker openings, microphone openings, ambient light sensors, and the like.

A RF shielding screen 104 is fitted against an inside surface of the frame member 102 such that the RF shielding screen 104 is aligned with the display void 102*b*. Thus the RF shielding screen 104 is disposed between the frame member 102 and the mobile device 110. The RF shielding screen 104 is constructed of a first clear film layer 104*a* that is electrically insulating, an electrically conductive grid layer 104*b*, and a second clear film layer 104*c* that is electrically insulating as well. The first clear film layer 104*a* and the second clear film 104*c* may be formed of any transparent material, such as plastic and glass.

In an embodiment of the present invention, the second clear film layer 104*c* functions as a substrate on which the grid layer 104*b* is formed by way of electronic printing, chemical vapor deposition, physical vapor deposition, and the like. In the case of printing, inks containing carbon nanotubes, copper, or other conductive materials can be used. Alternatively, the grid layer 104b may be a separately fabricated layer sandwiched between and bonded to the first plastic film layer 104a and the second plastic film layer 104c.

In an embodiment, the grid layer 104b is formed independent of the first clear film layer 104a and second clear film layer 104c. The wires of the grid layer 104b may be formed of individual wires woven together. It should be noted that the present invention does not require the first clear film layer 104a and the second clear film layer 104c for proper operation of the present invention. Rather, the grid layer 104b can be placed directly on to the mobile device 110. However, the first clear film layer 104a and second clear film layer 104c are provided for protection of both the surface of the display screen 110a from scratching by the grid layer 104b and protection of the wire traces of the grid layer 104b from damage due to contact with a user's fingers or other foreign objects.

In an embodiment of the present invention, the thickness of the RF shielding screen 104 is less than or equal to 0.005 inches (5 mils). However, the appropriate thickness of the RF shielding screen 104 may be greater than 5 mils as well, but is limited by the need to properly transmit user contact to the touch screen of the mobile device 110.

Figure 2:
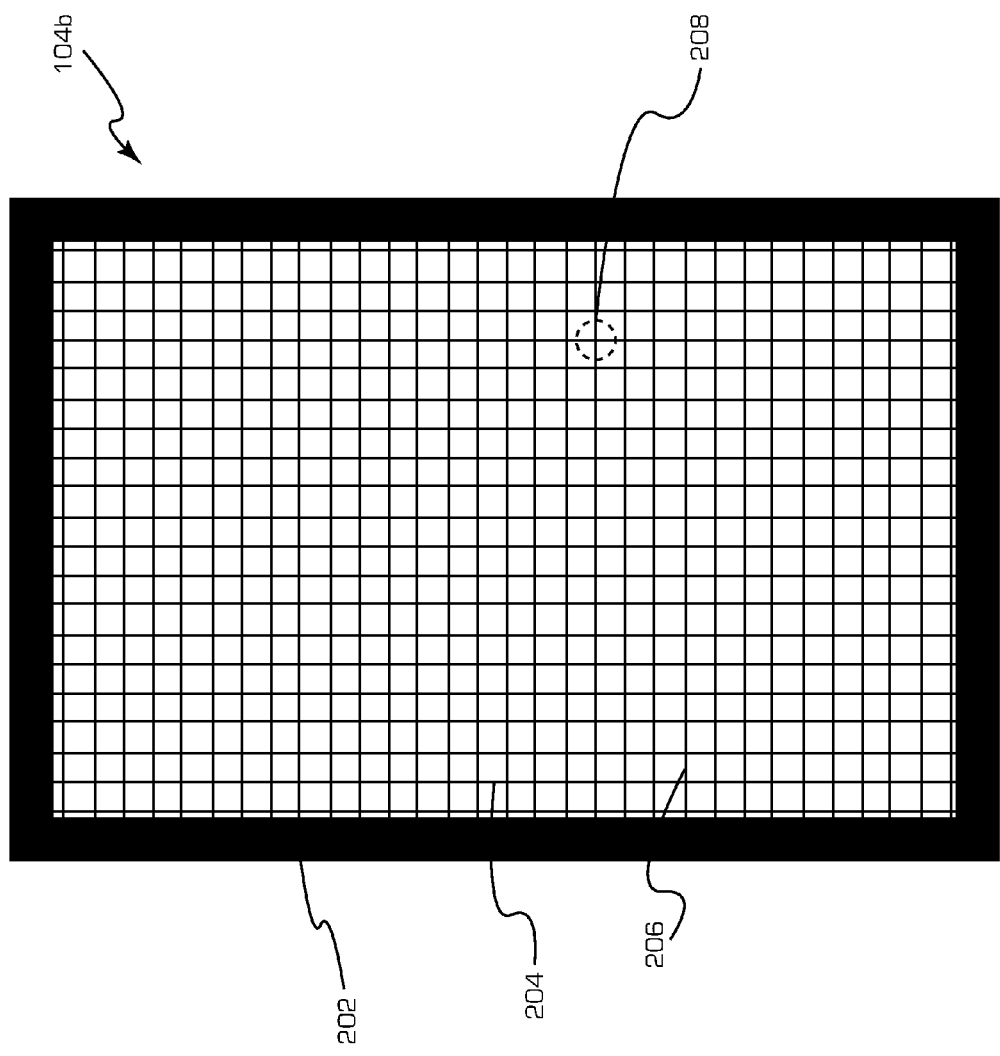
FIG. 2 illustrates an alternative embodiment of the present invention.

FIG. 2 shows a detailed representation of the structure of the grid layer 104b. The grid layer 104b has a conductive trace 202 formed around the perimeter of the grid layer 104b. Additionally, vertical wire traces 204 are provided between two parallel sides of the conductive trace 202. The two parallel sides are oriented perpendicular to the direction of the vertical wire traces 204. Also, horizontal wire traces 206 are provided between the two other parallel sides of the conductive trace 202. The two other parallel sides are oriented perpendicular to the direction of the horizontal wire traces 206.

Moreover, at intersection points 208, the vertical wire traces 204 and the horizontal wire traces 206 are in electrical contact with each other. Both ends of each of the vertical wire traces 204 and the horizontal wire traces 206 are also in electrical contact with the conductive trace 202. In this way, the grid layer 104b forms a plane of equipotential charge that negates the charge of the impinging RF field. The mesh spacing should be fine enough to block a significant portion of the RF signal, but course enough not to disable the touch screen functionality.

The RF shielding screen 104 is dimensioned to be larger than the display 110a. In an embodiment, the RF shielding screen 104 is dimensioned to cover the entirety of the front face of the mobile device 110. The conductive trace 202 is dimensioned with a width as large as possible without impinging the display 110a. In an embodiment of the present invention, the conductive trace 202 is arranged to correspond with an outside perimeter edge of the display 110a and extends to the outside perimeter edge of the RF shielding screen 104.

There are three electromagnetic affects working in the shield. All the conductive portions of the shield are electrically connected forming a plane of common potential. The configuration of the pattern of the RF shielding screen 104 exploits the aperture phenomenon where a RF waves react to a conductive mesh in a similar manner as a conductive sheet. If the spacing between the mesh elements is significantly smaller than the wavelength of the RF signal and the mesh elements are electrically connected, the mesh will reduce the transmission of, or block, the signal from the backside of the shield.

The third affect is the presence of the conductive material in close proximity of the phone's antenna. The material presents a path of lower impedance, compared to air, for the RF and attracts the signal and redirects it.

The mesh spacing (or pitch) should be fine enough to block a portion of the RF signal, but course enough not to disable the touch screen functionality. For example, to block at least 70% of RF, a mesh having a pitch of no greater than 5 mm is desirable. However, in the iPhone® 4/4s, the pitch cannot be less than 2 mm, otherwise the touch screen functionality will be degraded. Therefore, for an iPhone® 4/4s an appropriate RF shielding screen 104 has a pitch ranging between 2 mm and 5 mm.

Figure 3:
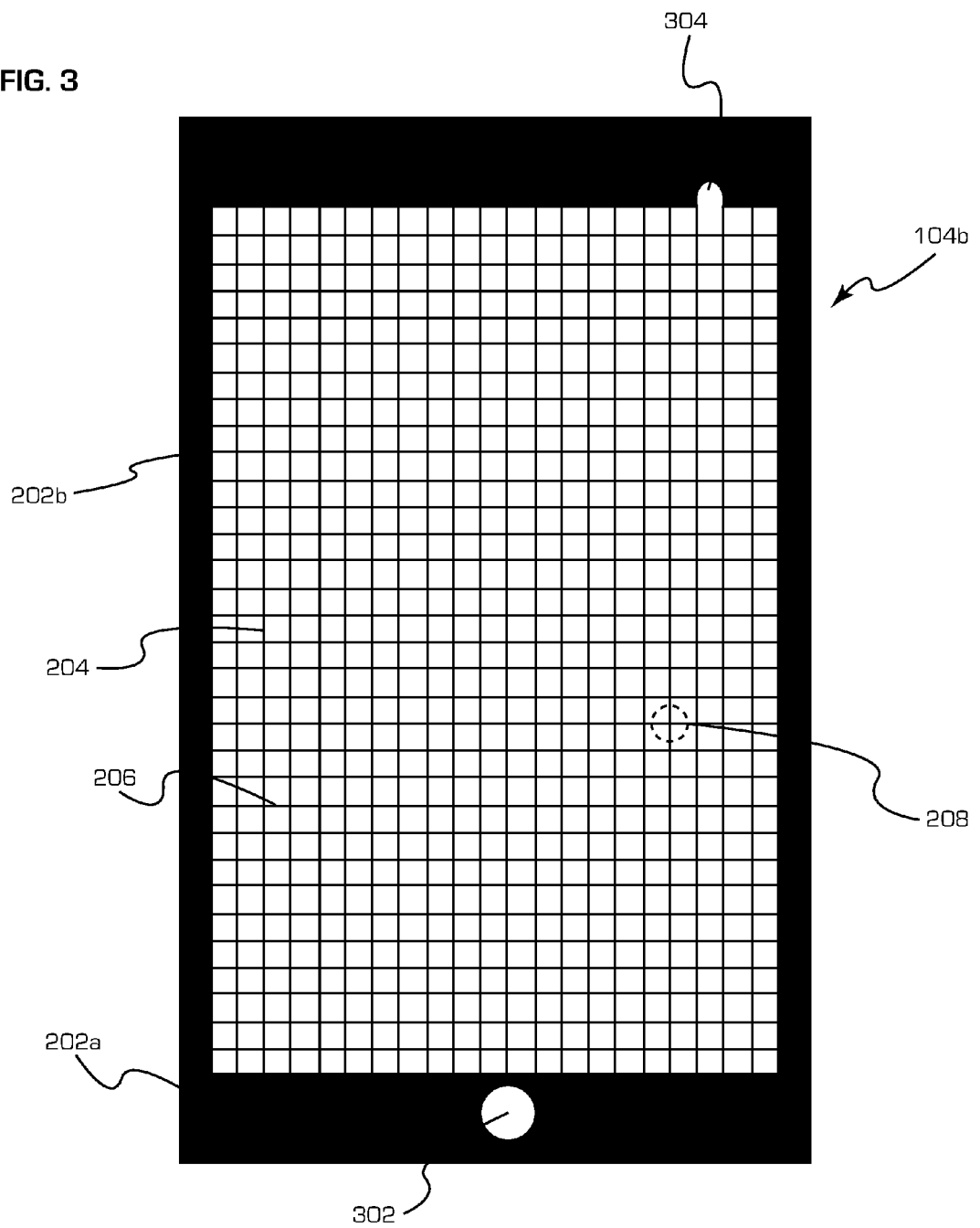
FIG. 3 illustrates an alternative embodiment of the present invention.

In another embodiment, shown in FIG. 3, the RF shielding screen 104 is shown in which the horizontal conductive trace 202a and vertical conductive trace 202b forming the conductive trace 202 have different widths. The variation in widths is dictated by the particular mobile device model. Additionally, the embodiment in FIG. 3 has a button cut-out 302 in the horizontal conductive trace 202a in order to allow access to a hardware button 110c. Also, camera cut-out 304 allows the front facing camera 110b of the mobile device to remain unobstructed by the horizontal conductive trace 202a.

The dimensions of the RF shielding screen 104 is dictated by the placement of the antennas within the mobile device. For example, in most mobile devices 110 that have antennas positioned generally inset from the edge of the mobile device casing, the RF shielding screen 104 can be dimensioned to extend to the edges of the mobile device 110 case. However, when the antenna is positioned along the edges of the mobile device 110 case, as is the case with the iPhone® 4/4s, the RF shielding screen 104 should extend beyond the edge of the mobile device 110 case by, for example, 0.08 inches in order to effectively block RF signals from transmitting on a generally forward direction toward a user's body.

Figure 4:
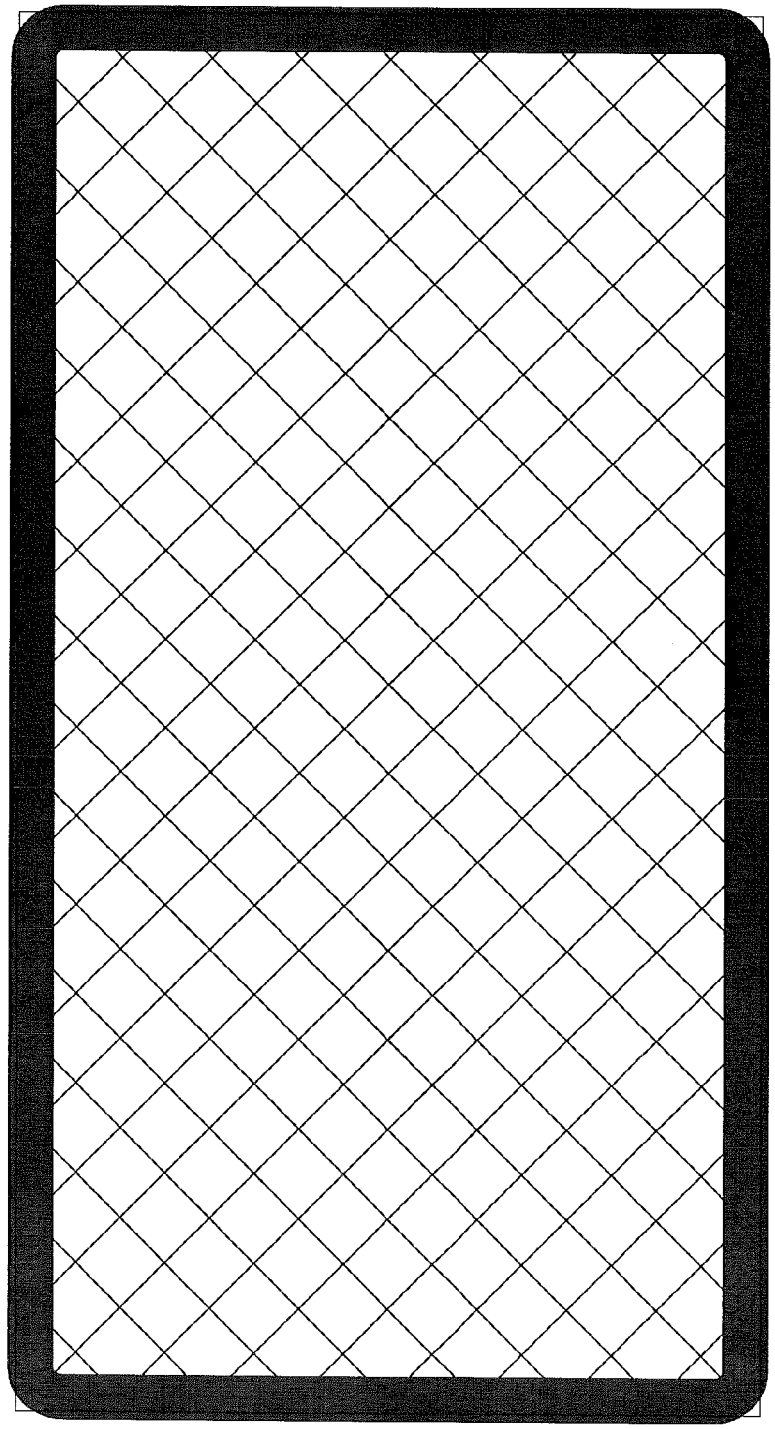
FIGS. 4 and 5 illustrate alternative patterns in accordance with the present invention.
Figure 5:
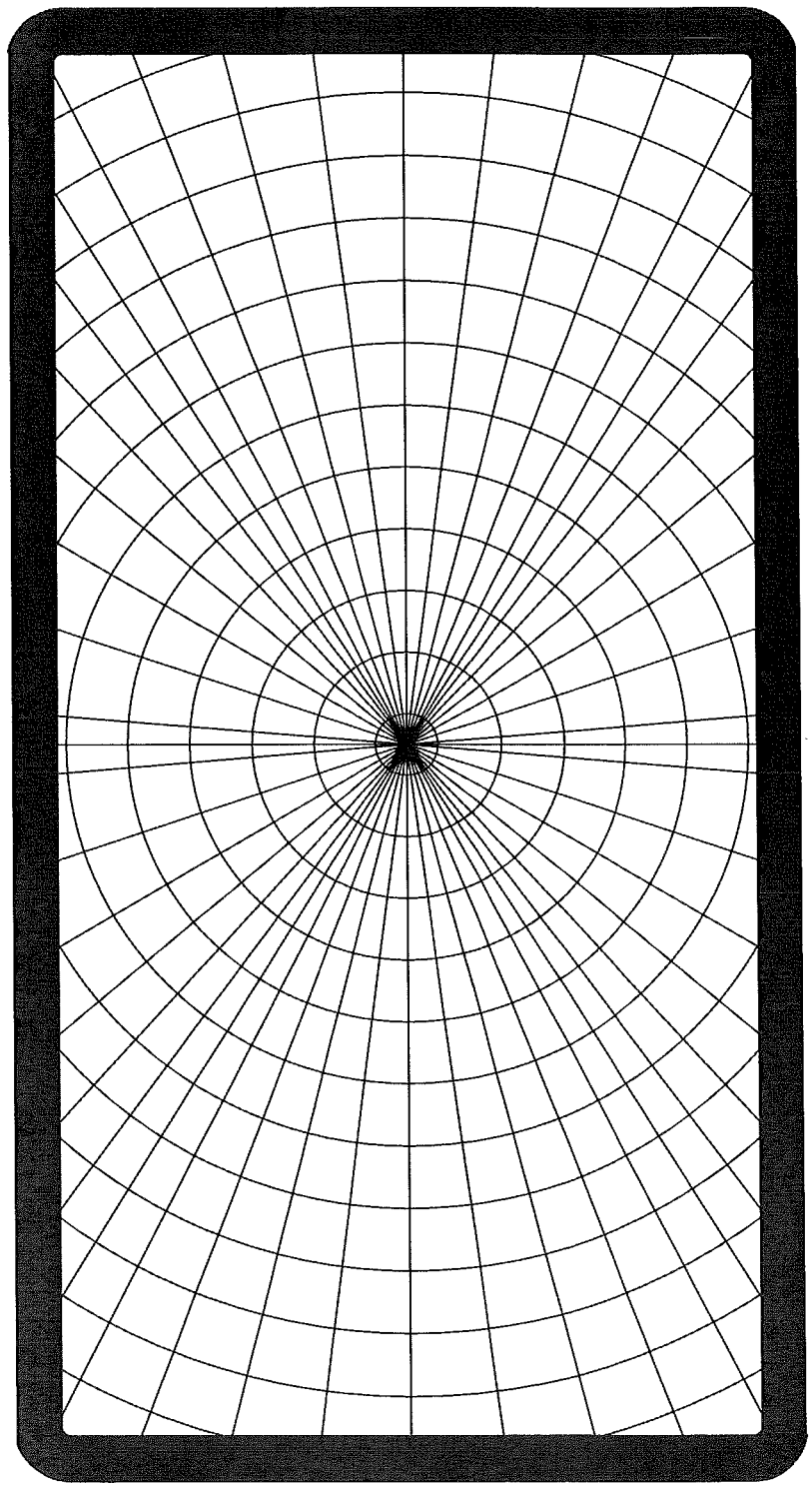

The above-described embodiments indicate that the RF shielding screen 104 has a grid pattern formed by intersecting wire traces at 90° with one another. However, grid alternative patterns may be effectively used as well. For example, FIG. 4 shows a diamond grid pattern in which the wire traces intersect at angles less than 90°. FIG. 5 shows a further embodiment in which the grid is patterned as first wire traces formed as concentric circles with radially extending intersecting lines formed of second wire traces.

In addition to the embodiment shown in FIG. 1 through FIG. 3, the present invention can be configured as a case, or pouch. In the present embodiment, the case is constructed with a layer of the RF shielding screen, which lines a portion of the inside of the case. The case main body is constructed of a plastic, a fabric or other similar material, such as leather, nylon, neoprene, and rubber. The main body is formed into a shape conforming to the silhouette of the mobile device.

The main body is formed, at a front surface, with an opening through which a portion of the RF shielding screen is exposed. Additionally, at a second side laying perpendicular to the front surface, the main body has a second opening dimensioned to slidingly accommodate insertion of the mobile device into an interior void formed by the main body. A flap, configured to removably hold the mobile device 106 in the case 300, may be provided on the main body as well.

Additionally, the case may be equipped with a clip allowing a user to fasten the case to an article of clothing, belt, pocket, or to objects such as a strap of a pocketbook, and the like.

In an alternative embodiment of the present invention, the RF shielding device is disposed inside a mobile device. In such an embodiment, the RF material can be layered within the mobile device. For example, the RF material may be disposed behind the touchscreen of the mobile device, such that the touchscreen is directly contactable by a user of the mobile device. Alternatively, the RF material may be disposed in front of the touchscreen and within the mobile device enclosure.

In the case where the RF material is placed in front of the touchscreen, the RF material must be constructed of a material that allows viewing of the touchscreen. On the other hand, if the RF material is placed behind the touchscreen, the materials are not required to be optically transparent.

The described embodiments of the present invention are intended to be illustrative rather than restrictive, and are not intended to represent every embodiment of the present invention. Various modifications and variations can be made without departing from the spirit or scope of the invention as set forth in the following claims both literally and in equivalents recognized in law.

What is claimed is:

1. An RF shielding device for mobile devices, the device comprising:
   a conductive grid having first wire traces and second wire traces in electrical contact with each other at intersection points; and
   a conductive trace disposed around the perimeter of the conductive grid, the conductive trace being in electrical contact with both ends of each of the first wire traces and the second wire traces.

2. The device as in claim 1, further comprising:
   a first insulating film disposed on a top surface of the conductive grid; and
   a second insulating film disposed on a bottom surface of the conductive grid and the conductive trace,
   wherein the first insulating film and the second insulating film are of a transparent material.

3. The device as in claim 1, further comprising an adhesive layer disposed on a surface of the RF shielding device intended for contact to a front surface of the mobile device.

4. The device as in claim 1, wherein the conductive grid and the conductive trace are formed of materials selected from: metals, metal alloys, plastics, inks, and paints.

5. The device as in claim 1, further comprising a frame adapted to hold the RF shielding device in place against a front surface of the mobile device.

6. The device as in claim 5, wherein at least a portion of the frame is formed of a material substantially transparent to RF radiation emitted and received by the mobile device.

7. The device as in claim 6, wherein the frame is configured to hold the mobile device within the frame.

8. The device as in claim 5, wherein the frame is formed as a case having a second opening on a side dimensioned to accommodate sliding a mobile device into the void.

9. An RF shielding device for mobile devices, the device comprising:
   a conductive grid having first wire traces and second wire traces in electrical contact with each other at intersection points; and
   a conductive trace disposed around the perimeter of the conductive grid, the conductive trace being in electrical contact with both ends of each of the first wire traces and the second wire traces;
   a first insulating film disposed on a top surface of the conductive grid; and
   a second insulating film disposed on a bottom surface of the conductive grid and the conductive trace,
   wherein the first insulating film and the second insulating film are of a transparent material.

10. The device as in claim 9, further comprising an adhesive layer disposed on a surface of the RF shielding device intended for contact to a front surface of the mobile device.

11. The device as in claim 9, wherein the conductive grid and the conductive trace are formed of materials selected from: metals, metal alloys, plastics, inks, and paints.

12. The device as in claim 9, further comprising a frame adapted to hold the RF shielding device in place against a front surface of the mobile device.

13. The device as in claim 12, wherein at least a portion of the frame is formed of a material substantially transparent to RF radiation emitted and received by the mobile device.

14. The device as in claim 13, wherein the frame configured to hold the mobile device within the frame.

15. The device as in claim 12, wherein the frame is formed as a case having a second opening on a side dimensioned to accommodate sliding a mobile device into the void.

16. An RF shielding device for mobile devices, the device comprising:
   a conductive grid having first wire traces and second wire traces in electrical contact with each other at intersection points; and
   a conductive trace disposed around the perimeter of the conductive grid, the conductive trace being in electrical contact with both ends of each of the first wire traces and the second wire traces;
   a first insulating film disposed on a top surface of the conductive grid;
   a second insulating film disposed on a bottom surface of the conductive grid and the conductive trace; and
   a frame adapted to hold the RF shielding device in place against a front surface of the mobile device,
   wherein the first insulating film and the second insulating film are of a transparent material.

17. The device as in claim 16, wherein at least a portion of the frame is formed of a material substantially transparent to RF radiation emitted and received by the mobile device.

18. The device as in claim 17, wherein the frame configured to hold the mobile device within the frame.

* * * * *